United States Patent [19]
Schmidt et al.

[11] Patent Number: 5,008,496
[45] Date of Patent: Apr. 16, 1991

[54] THREE-DIMENSIONAL PRINTED CIRCUIT BOARD

[75] Inventors: Hans-Fr. Schmidt, Eurasburg; Siegfried Rauchmaul, Munich; Juergen Bednarz, Penzberg, all of Fed. Rep. of Germany

[73] Assignee: Siemens Aktiengesellschaft, Berlin and Munich, Fed. Rep. of Germany

[21] Appl. No.: 383,648

[22] Filed: Jul. 24, 1989

[30] Foreign Application Priority Data

Sep. 15, 1988 [DE] Fed. Rep. of Germany ....... 3831432

[51] Int. Cl.$^5$ .............................................. H05K 1/00
[52] U.S. Cl. ...................... 174/254; 29/829; 29/830; 174/255; 264/241; 264/242; 361/398
[58] Field of Search ...................... 174/68.5, 254, 255; 361/398; 29/829, 830; 264/241, 242

[56] References Cited
U.S. PATENT DOCUMENTS 4,066,851 1/1978 White et al. ................ 361/398 X
4,402,135 9/1983 Schweingruber et al. ........... 29/832
4,710,419 12/1987 Gregory .............................. 428/210
4,772,496 9/1988 Maeda et al. ...................... 428/35.9

Primary Examiner—Morris H. Nimmo
Attorney, Agent, or Firm—Hill, Van Santen, Steadman & Simpson

[57] ABSTRACT

A three dimensional printed circuit board having at least two rigid board sections capable of being arranged in different planes and flexibly connected by connecting sections between adjacent board sections is manufactured as a one-piece injection molded part of a thermoplastic molding material. The flexible connecting sections are fashioned as thin regions having a thickness less than the thickness of the rigid board sections. When a semi-crystalline or liquid-crystalline thermoplastic molding material is used, the connecting sections are formed as flexible film hinges, whereas an amorphous thermoplastic molding material results in the connecting sections being bendable only under the influence of heat.

20 Claims, 1 Drawing Sheet

THREE-DIMENSIONAL PRINTED CIRCUIT BOARD

BACKGROUND OF THE INVENTION

1. Field of the Invention

The present invention relates to a three-dimensional printed circuit board having at least two rigid plate sections arranged in different planes and joined by flexible joining sections between adjacent plate sections.

2. Description of the Related Art

Planar printed circuit boards with high component density have space requirements which inevitably lead to an increase in the housing size of the electric or electronic device in which they are integrated. Moreover, the overall shape of the electronic device is determined by the geometry of the planar printed circuit boards.

It is known that printed circuit boards with a rigid-flexible structure are adaptable to the shape of a device, for example, to form a box, so that the device determines the geometry of the printed circuit board. This known two-dimensional printed circuit board is basically composed of two basic members, namely a rigid plate and a flexible film laminated thereon. It is possible to provide single or multiple arrangements of rigid plates and flexible film. The rigid plate, or board, constitutes a component carrier with contacts on one side whereas the film carries interconnects. This means that the film performs the function of connecting the plates in a flexible fashion which permits, with certain steps, the form of the circuit board assembly to be adapted to the device. The geometry of the plates or boards, the joining and assembling parts, as well as the contact holes are generated by means of additional drilling and/or punching steps.

SUMMARY OF THE INVENTION

An object of the present invention is to provide a three-dimensional printed circuit board with rigid board sections and flexible connecting sections which can be manufactured in large numbers using economical technology.

These and other objects of the invention are achieved according to the invention by board sections and joining sections being produced as one-piece injection molded parts composed of a thermal plastic molding material, whereby the joining sections are formed as thin locations having a thickness which is less than the thickness of the board sections.

Three dimensional circuit boards, in the context of the present invention, include circuit boards which have flexible sections to permit the circuit board to be bent or otherwise formed into a non-planar shape.

The three dimensional printed circuit board of the invention is manufactured in one-piece by injection molding, which is a particularly economical technology for manufacturing objects which are formed without cutting. A prerequisite for the application an injection molding process to the present invention is that the joining sections are formed as thin regions which have a reduced thickness compared to that of the board sections. These thin regions enable the three-dimensional printed circuit board to be bent or folded over relative to the rigid board sections, whereby unacceptable elongation of the interconnects which are on the joining sections is prevented by the reduced thickness of the thin regions. Apart from being extremely economical to manufacture, the use of such printed circuit boards can lead to miniaturization of the device as well as to improvement in the design of the device in which the circuit board is used. This is so since the present circuit board does not limit the size or design of the overall device.

According to a first preferred embodiment of the invention, the printed circuit board is an injection molded part manufactured from a semi-crystalline or liquid-crystalline thermoplastic molding material and the connecting sections are formed as flexible film hinges. Due to the selection of a semi-crystalline or liquid-crystalline thermoplastic as a molding material for the injection molding process, and due to the selection of correspondingly different thicknesses for the board sections and joining sections, an injection molded part is formed wherein the rigid board sections are connected by flexible sections referred to as film hinges.

According to a variation of the invention, it is provided that the injection molded part is manufactured from an amorphous thermoplastic material and that the connecting sections are formed as thin regions which are made flexible under the influence of heat. Due to the selection of an amorphous thermoplastic as a molding material for the injection molding process, the connecting sections, or joining sections, of the injection molded circuit board which are formed as thin regions can only be bent under the influence of heat. The application of heat, thus, enables the printed circuit board to be bent or folded over without fracturing so that the plural rigid plate sections are formed into a three-dimensional form.

To provide for bending of the connecting or joining sections without unacceptable stretching of the interconnects lying thereon, it has proved advantageous that the connecting sections have a thickness of at most 0.6 mm and preferably at most 0.3 mm. An optimal thickness of the connecting sections lies in a range of approximately between 0.1 and 0.2 mm.

In contrast thereto, the board, or plate, sections are of a thickness of between 0.9 and 1.6 mm to provide for rigidity without excessive use of material.

A further reduction of the manufacturing costs is achieved by the board sections having contact holes which are formed during the injection molding process. Similarly, it is possible to utilize the shaping options of the injection molding process to provide the board sections with joining and/or assembling aids which are formed in conjunction with the injection molding.

DETAILED DESCRIPTION OF THE PREFERRED EMBODIMENTS

Figure 1:
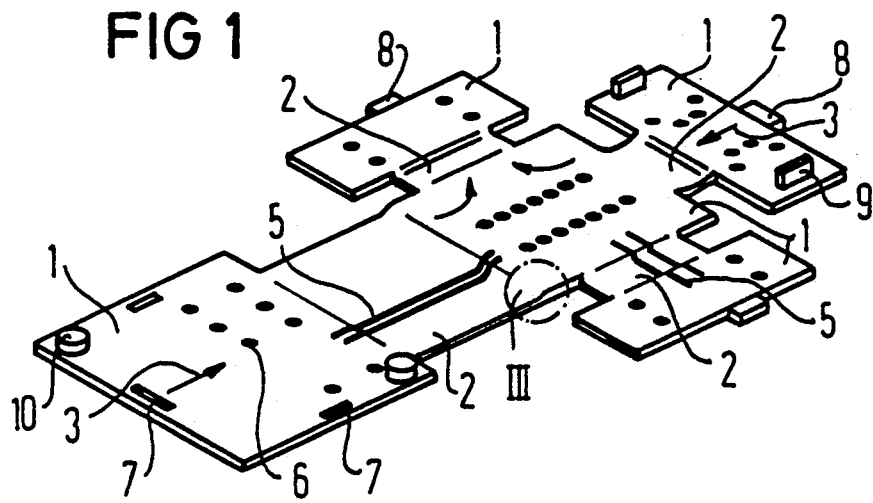
FIG. 1 is a perspective view of a printed circuit board according to the principles of the present invention which comprises a flat injection molded part having five rigid board sections and four flexible joining sections.
Figure 2:
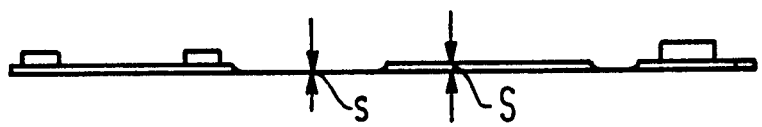
FIG. 2 is a side elevational view of the injection molded printed circuit board of FIG. 1 taken generally in the direction of arrow II.

In FIG. 1 is shown a flattened out injection molded part having five rigid board sections 1 connected to one another in a one-piece fashion be joining sections 2 formed as flexible film hinges. As can be seen in the side view of FIG. 2 and in the detailed illustration of FIG. 3, the joining sections 2 are thin regions having a thickness s which is considerably less than the thickness S of the board sections 1. The board sections 1 are arranged in the injection molding die so that the subsequent bending of the film hinges or joining sections 2 ensues parallel to an injection molding flow front 3, as marked by arrows in FIG. 1.

Figure 3:
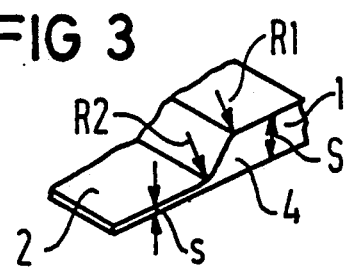
FIG. 3 is an enlarged detail of a transition area between a board section and a joining section of the injection molded part shown in FIG. 1, generally in the region III.

With reference to FIG. 3, between the board sections 1 and the connecting sections 2 are formed transition areas 4 which have radii of curvature R1 and R2 such that it is possible to rotate the rigid board sections in fracture resistant fashion to form a three dimensional form corresponding to the geometry of electronic device. In addition, the radii of curvature R1 and R2 make it possible to metalize both sides of the circuit board and to structure interconnects 5 as shown in FIG. 1. In other words, by avoiding sharp corners, the radii R1 and R2 permit metal interconnects to be applied on both sides of the circuit board without the risk of breakage during bending.

The injection molded part shown in FIG. 1 also includes contact holes 6, means for aiding in the joining of the board portions in the form of slots 7 and allocated projections 8, as well as cubical and cylindrical assembling aids or means 9 and 10, which are all formed in at the time of the injection molding process.

Figure 4:
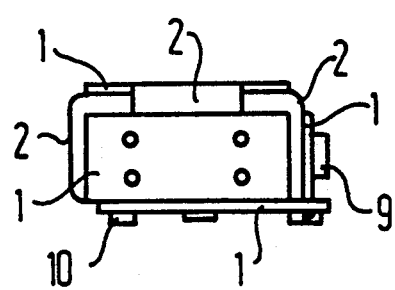
FIG. 4 is a side elevational view of the injection molded part of FIG. 1 which has been bent to form a three dimensional printed circuit board in the form of a final folded box-shaped assembly.

In the case of an injection molded part which is spread out or flattened out in a plane as shown in FIG. 1, a right board section 1a as well as a front board section 1b and a back board section 1c are bent downward via the allocated flexible joining sections 2a, 2b and 2c by approximately 90°. A left board section 1d is bent downward about a 180° angle by bending of the joining section 2d. The three slots 7 in the board 1d are pressed on the allocated tabs 8 of the three, now vertical board sections 1a, 1b and 1c. The result is that the a three-dimensional box-shaped printed circuit board with five rigid board sections 1 and four flexible joining sections 2 is formed, as shown in FIG. 4. One side wall of the box of FIG. 4 is formed by the flexible joining section 2d which is bent about 180°.

In the case of the above described exemplary embodiment, the injection molded part is composed of a semi-crystalline thermoplastic such as polyamide. The use of a liquid-crystalline thermoplastic, as the material for the injection molded part, such as a molding material distributed by the company Celanese, USA, under the name "Vectra", is also possible. In the exemplary embodiment, the larger thickness S of the board sections 1 is, for example, 1.4 mm, whereas the connecting or joining sections 2 have a thickness of approximately 0.15 mm which proves to be very favorable.

As an alternate to the described exemplary embodiment, the injection molded part shown in FIG. 1 can also be composed of an amorphous thermoplastic such as polyetherimid or polyethersulfone. In this case, however, the joining sections 2 are not flexible film hinges but instead are hinges which are moldable under the influence of heat. Therefore, the joining sections 2 are heated until they reach a softening range for the respective amorphous thermoplastic, and are then bent into the form illustrated in FIG. 4. After cooling down, the connecting sections harden again.

As is of course obvious to one of skill in the art, the principles of the present invention are applicable to printed circuit boards having any variety of shapes with different numbers and arrangements of rigid sections and flexible sections. Various arrangements of slots, projections and other fastening and assembling means are also possible. Thus, there is shown an injection molded circuit board which conforms to the shape and design of the article in which it is used, rather than the shape and design of the article being limited by the presence of a circuit board. The injection molded circuit board is formed in a simple, economical step without requiring drilling and cutting of holes or attachment of other circuit board parts.

Although other modifications and changes may be suggested by those skilled in the art, it is the intention of the inventors to embody within the patent warranted hereon all changes and modifications as reasonably and properly come within the scope of their contribution to the art.

I claim:

1. A three-dimensional printed circuit board, comprising:

two rigid plate sections capable of lying in different planes;

a flexible connecting section between adjacent plate sections; and said plate sections and said connecting section being manufactured as a one-piece injection molded part of a thermoplastic molding material, said connecting section being formed as a weak area of a lesser thickness than said plate sections.

2. A three-dimensional printed circuit board as claimed in claim 1, wherein said injection molded part is of semi-crystalline or liquid-crystalline thermoplastic molding material, and said connecting section is formed as a flexible film hinge.

3. A three-dimensional printed circuit board as claimed in claim 1, wherein said injection molded part is of an amorphous thermoplastic molding material, and said connecting section is formed as a weak area which is bendable under the influence of heat.

4. A three-dimensional printed circuit board as claimed in claim 1, wherein said connection section is of a thickness of no more than 0.6 mm.

5. A three-dimensional printed circuit board as claimed in claim 1, wherein said connection section is of a thickness of no more than 0.3 mm.

6. A three-dimensional printed circuit board as claimed in claim 1, wherein said connecting section is of a thickness of between 0.1 to 0.2 mm, inclusive.

7. A three-dimensional printed circuit board as claimed in claim 4, wherein said plate sections are of a thickness of between 0.9 to 1.6 mm, inclusive.

8. A three-dimensional printed circuit board as claimed in claim 1, wherein said plate sections include contact holes formed during injection molding.

9. A three-dimensional printed circuit board as claimed in claim 1, further comprising:

means for joining said plate sections to one another, said means for joining being formed during injection molding.

10. A three-dimensional printed circuit board as claimed in claim 1, further comprising:

means for aiding assembly formed on said plate sections during injection molding.

11. A three-dimensional printed circuit board as claimed in claim 1, further comprising:
   further rigid plate sections molded in one-piece with said two plate sections; and
   further flexible connecting sections between adjacent ones of said further plate sections and ones of said two plate sections, said further connecting sections being of a lesser thickness than a thickness of said plate sections.

12. A circuit board for holding electrical components, comprising:
   first sections of a first thickness, said first thickness being such that said first sections are substantially rigid;
   second sections molded in one-piece with said first sections and being of a second thickness, said second thickness being thinner than said first thickness and being such that said second sections are flexible, said second sections joining said first sections to one another.

13. A circuit board as claimed in claim 12, wherein said first sections are substantially planar.

14. A circuit board as claimed in claim 12, wherein said first thickness is in a range of 0.9 mm to 1.6 mm and said second thickness is no more than 0.6 mm.

15. A method for forming printed circuit boards, comprising the steps of:
   injection molding a part of a thermoplastic material to form rigid board sections connected by joining sections in said part, the joining sections being of a thickness substantially less than a thickness of the rigid board sections; and
   bending the injection molded part at the joining sections to form a three-dimensional circuit board.

16. A method as claimed in claim 15, wherein said step of bending involves the application of heat.

17. A method as claimed in claim 15, further comprising the step of:
   forming contact holes in said rigid board sections during said step of injection molding.

18. A method as claimed in claim 15, wherein said rigid board sections have a thickness in the range of between approximately 0.9 and 1.6 mm and said joining sections have a thickness of no greater than 0.6 mm.

19. A method as claimed in claim 15, wherein said step of injection molding results in flow fronts of molding material which extend generally parallel to the joining sections.

20. A method as claimed in claim 15, further comprising the steps:
   forming joining aids and assembling aids on said part during said step of injection molding.

* * * * *